United States Patent [19]

Ushikoshi et al.

[11] Patent Number: 5,683,606
[45] Date of Patent: Nov. 4, 1997

[54] CERAMIC HEATERS AND HEATING DEVICES USING SUCH CERAMIC HEATERS

[75] Inventors: Ryusuke Ushikoshi, Tajima; Atsushi Sakon, Nagoya; Koichi Umemoto, Toyota; Yusuke Niiori, Inuyama, all of Japan

[73] Assignee: NGK Insulators, Ltd., Japan

[21] Appl. No.: 359,742

[22] Filed: Dec. 20, 1994

[30] Foreign Application Priority Data

Dec. 20, 1993 [JP] Japan ................. 5-344597
Jan. 21, 1994 [JP] Japan ................. 6-005343

[51] Int. Cl.⁶ .............. H05B 3/44; F27D 11/00
[52] U.S. Cl. ............................ 219/544; 219/385
[58] Field of Search .................. 219/543, 544, 219/553, 552, 270, 385; 428/469, 472; 338/257, 275, 262, 22 SD; 392/416

[56] References Cited

U.S. PATENT DOCUMENTS

| | | | |
|---|---|---|---|
| 4,357,526 | 11/1982 | Yamamoto et al. | 219/544 |
| 4,550,245 | 10/1985 | Arai et al. | 219/405 |
| 4,755,654 | 7/1988 | Crowley et al. | 219/405 |
| 4,804,823 | 2/1989 | Okuda et al. | 219/553 |
| 4,873,151 | 10/1989 | Satu et al. | 428/627 |
| 4,912,305 | 3/1990 | Tatemasu et al. | 219/544 |
| 4,965,659 | 10/1990 | Sasame et al. | 357/81 |
| 5,070,701 | 12/1991 | Saeki et al. | 62/3.1 |
| 5,142,650 | 8/1992 | Kida et al. | 219/120 |
| 5,188,286 | 2/1993 | Pence, IV | 236/1 F |
| 5,231,690 | 7/1993 | Soma et al. | 219/385 |
| 5,280,156 | 1/1994 | Niori et al. | 219/385 |
| 5,306,695 | 4/1994 | Ushikoshi et al. | 214/385 |
| 5,490,228 | 2/1996 | Soma et al. | 219/385 |

FOREIGN PATENT DOCUMENTS

| | | | |
|---|---|---|---|
| 4-087181 | 3/1992 | Japan | 219/544 |
| 4-87179 | 3/1992 | Japan | H05B 3/18 |
| 5-101871 | 4/1993 | Japan | H05B 3/02 |
| 5-271730 | 10/1993 | Japan | 219/120 |

*Primary Examiner*—Geoffrey S. Evans
*Assistant Examiner*—Sam Paik
*Attorney, Agent, or Firm*—Parkhurst, Wendel & Burr, L.L.P.

[57] ABSTRACT

A ceramic heater includes a substrate made of aluminum nitride, a resistive heating element buried in the substrate and made of a metal having a high melting point, and terminals electrically connected to the resistive heating element and buried in said substrate. The terminals are made of a metal having a high melting point and a coefficient of thermal expansion not smaller than that of the substrate. The metal of the resistive heating element has a coefficient of thermal expansion not smaller than that of the substrate. The coefficient of thermal expansion of each of the terminals and the resistive heating element is in a range from $5.0 \times 10^{-6}/°C$ to $8.3 \times 10^{-6}/°C$.

19 Claims, 8 Drawing Sheets

FIG_1
PRIOR ART

FIG_4

FIG_6

CERAMIC HEATERS AND HEATING DEVICES USING SUCH CERAMIC HEATERS

BACKGROUND OF THE INVENTION (1) Field of the Invention

The present invention relates to ceramic heaters and heating devices using such ceramic heaters, which ceramic heaters and the heating devices can be suitably used for plasma CVD, pressure-reduced CVD, plasma etching, photo-etching, and for melting and solidifying alloys and glass.

(2) Related Art Statement

Heretofore, so-called stainless heaters and indirect heating type heaters have been ordinarily used in the semiconductor-producing apparatuses such as etching apparatuses and chemical gas phase growing apparatuses. However, when these heating sources are used, there is the possibility that particles are produced under the action of a halogen-based corrosive gas. Further, the heating efficiency is not good. In order to solve these problems, the present inventors proposed a ceramic heater in which a wire buried in a dense ceramic substrate and made of a metal having a high melting point. This wire is spirally wound inside the discoidal substrate, and terminals connected to opposite ends of the wire, respectively. It was found that such a ceramic heater had excellent performance particularly for the production of the semiconductors.

In order to produce such a ceramic heater, a wound member is obtained by winding a linear member or a wire made of a metal having a high melting point, and terminals are connected to the opposite ends of the wound member. On the other hand, a ceramic powder is charged into a press-molding machine in which the ceramic powder is preliminarily molded to a given hardness. At that time, a continuous depression or groove is formed on the surface of the preliminarily molded body according to a given planar pattern. The wound member is placed inside the depression, and ceramic powder is added to the surface of the preliminarily molded body. A discoidal molded body is obtained by uniaxially press molding the entirety of the ceramic powder, and the discoidal molded body is sintered by hot pressing.

The reason why the ceramic heater is made in a discoidal shape is as follows. That is, in the conventional stainless heater, a semiconductor wafer-heating surface is spaced from terminals of a resistive heating element by a large distance, and the terminals are connected to external power supply cables outside a vessel of the semiconductor producing apparatus. The heating section reaches a high temperature, and is exposed to a corrosive atmosphere, whereas the connections between the terminals and the power supply cables are not exposed to such a high temperature or corrosive atmosphere. To the contrary, since the above ceramic heater is produced by placing the resistive heating element inside the ceramic powder and uniaxially press molding the powder, a simple molding shape such as a discoidal shape must be adopted from the standpoint of productivity. In addition, since a fired modified layer called a fire skin exists on the surface of the fired body, such a fired modified layer must be removed by machining. In the machining, the fired body needs to be ground with a diamond grinding wheel or the like. Therefore, if the shape of the fired body is complicated, the grinding cost becomes very high. Therefore, a simple shape such as the discoidal shape must be adopted from the standpoint of production ease in the case of the ceramic heaters in which the resistive heating element is buried. Therefore, it was very difficult to take out the terminals of the heater outside the vessel of the semiconductor-producing apparatus from the point of the structure. Thus, the terminals are inevitably exposed to high temperature and the corrosive gas.

In order to solve the above problem, NGK INSULATORS, LTD. disclosed in unexamined Japanese patent application Laid-open No. 4-87179 a method for connecting terminals of a ceramic heater to power supply members in a heat-resistive and corrosion-resistive manner. In this case, it is necessary that the diameter of the terminals is made larger, and the end of the resistive heating element is connected to the terminals.

However, it was found that the production of this ceramic heater produced a new problem. In this producing method, the terminals are connected to the respective opposite ends of the resistive heating element, the resistive heating element and the terminals are buried in the ceramic powder, and the resulting powdery body is molded and fired by hot pressing. However, the ceramic substrate happens to crack near the terminals during shrinking after the firing. In order to solve this problem, NGK INSULATORS, LTD. discloses in unexamined Japanese patent application Laid-open No. 5-101,871 a technique that terminals are made of a metal having a melting point higher than that of the ceramic substrate. By adopting this construction, the ceramic substrate is prevented from being cracked near the terminals.

However, it was found that a further new problem occurred in the ceramic heater disclosed in this publication. That is, according to the above publication, a ceramic substrate is preferably made of aluminum nitride, and terminals are made of molybdenum having a coefficient of thermal expansion greater than aluminum nitride. Further, the resistive heating element is not cracked at the time of the shrinkage in the firing, the resistive heating element is made of tungsten. The reason why tungsten is selected as a material for the resistive heating element is that tungsten has relatively high stability for high temperatures at the time of firing.

The production of such a ceramic heater by firing in the hot press revealed that the substrate was not cracked near the terminals or the resistive heating element. In this respect, the technique described in unexamined Japanese patent application Laid-open No. 5-101,871 is effective. However, unexpected test results occurred during testing the useful life of this ceramic heater.

That is, the present inventors subjected such a ceramic heater to a repeated heating-cooling test between 800° C. and room temperature. As a result, it was found that the aluminum nitride substrate was cracked near the resistive heating element, and such a crack propagated. This crack was not observed after the firing at all, and was first produced in the repeated heating-cooling test.

SUMMARY OF THE INVENTION

An object of the present invention is to prevent occurrence and propagation of cracks in a substrate made of aluminum nitride near a resistive heating element in a ceramic heater when the ceramic heater is subjected to the repeated heating-cooling test.

The ceramic heater according to a first aspect of the present invention comprises a substrate made of aluminum nitride, a resistive heating element buried in said substrate and made of a metal having a high melting point, and terminals electrically connected to said resistive heating element and buried in said substrate, wherein said terminals are made of a metal having a high melting point and a coefficient of thermal expansion not smaller than that of said substrate, resistance heat generation is made of a metal having a high melting point and having a coefficient of thermal expansion not smaller than that of the substrate, the coefficient of thermal expansion of each of the terminals and the resistive heating lement is in a range from $5.0 \times 10^{-6}/°C$. to $8.3 \times 10^{-6}/°C$.

Further, the ceramic heater according to the present invention comprises a substrate made of aluminum nitride, a resistive heating element buried in said substrate, and terminals electrically connected to said resistive heating element and buried in said substrate, wherein said terminals are made of a metal having a high melting point and a coefficient of thermal expansion not smaller than that of said substrate, said resistive heating element includes a heat generator body made of a metal having a high melting point and a coefficient of thermal expansion not smaller than that of said substrate, a carbide layer provided on an outer side of said heat generator body and made of a metal having a high melting point, an oxide layer provided on an outer side of said carbide layer and having a high melting point, the coefficient of thermal expansion of each of the terminals and the resistive heating lement is in a range from $5.0 \times 10^{-6}/°C$. to $8.3 \times 10^{-6}/°C$.

The following are preferred embodiments of the ceramic heaters according to the first and second aspects of the present invention.

(1) The resistive heating element is made of molybdenum.

(2) The resistive heating element is made of a molybdenum-tungsten based alloy, and the content of molybdenum in said alloy is in a range from 50 to 100 atom %.

(3) The carbide is molybdenum carbide, and the oxide is molybdenum oxide.

The heating device according to a third aspect of the present invention comprises a ceramic heater, and a cooler for cooling said ceramic heater, said ceramic heater comprising a substrate made of aluminum nitride, a resistive heating element buried in said substrate and made of a metal having a high melting point, and terminals electrically connected to said resistive heating element and buried in said substrate, wherein said terminals are made of a metal having a high melting point and a coefficient of thermal expansion not smaller than that of said substrate, the metal of the resistive heating element has a coefficient of thermal expansion not smaller than that of the substrate, the coefficient of thermal expansion of each of the terminals and the resistive heating lement is in a range from $5.0 \times 10^{-6}/°C$. to $8.3 \times 10^{-6}/°C$.

Further, the heating device according to a fourth aspect of the present invention comprises a ceramic heater and a cooler for cooling said ceramic heater, said ceramic heater comprising a substrate made of aluminum nitride, a resistive heating element buried in said substrate, and terminals electrically connected to said resistive heating element and buried in said substrate, wherein said terminals are made of a metal having a high melting point and a coefficient of thermal expansion not smaller than that of said substrate, said resistive heating element includes a heat generator body made of a metal having a high melting point and a coefficient of thermal expansion not smaller than that of said substrate, a carbide layer provided on an outer side of said heat generator body and made of a metal having a high melting point, an oxide layer provided on an outer side of said carbide layer and having a high melting point, the coefficient of thermal expansion of each of the terminals and the resistive heating lement is in a range from $5.0 \times 10^{-6}/°C$. to $8.3 \times 10^{-6}/°C$. In the specification, the term "carbide layer" includes not only a layer made of a carbide of the metal but also a metal carbide-rich layer, and the term "oxide layer" includes not only a layer made of an oxide of the metal but also a metal oxide-rich layer.

The following are preferred embodiments of the third and fourth aspect of the present invention.

(1) The resistive heating element is made of molybdenum.

(2) The resistive heating element is made of a molybdenum-tungsten based alloy, and the content of molybdenum in said alloy is in a range from 50 to 100 atom %.

(3) The carbide is molybdenum carbide, and the oxide is molybdenum oxide.

(4) The cooler cools said ceramic heater at a cooling rate of 60° C./min. or more, when the ceramic heater is to be cooled.

(5) The high melting point metal constituting said resistive heating element and that of the terminals are selected from molybdenum and an alloy containing molybdenum.

The present inventors have examined the reason why when the ceramic heater was subjected to the repeated heating-cooling test, cracks, which had not been observed after the hot press sintering, occurred and propagated. As a result, it was found that when the resistive heating element was made of a metal having a high melting point and a coefficient of thermal expansion not smaller than that of the substrate, the cracking due to the repeated heating-cooling cycles could be prevented. The present invention has been accomplished based on this finding.

This will be further explained. As shown in a schematic view of FIG. 1, a resistive heating element 22 is buried in a substrate 70. The outer peripheral surface 22a of the resistive heating element 22 contacts the substrate 70. When the ceramic heater is subjected to the heating-cooling cycles, it is considered that tensile stress occurs in the substrate 70, so that microcracks 30 are radially formed and propagate.

It is considered that when the resistive heating element 22 is made of the metal having a high melting point and a coefficient of thermal expansion not smaller than that of the substrate 70, the tensile stress acting upon the substrate 70 during the heating-cooling cycles is diminished, so that the occurrence and propagation of the microcracks is suppressed in the substrate.

These and other objects, features, and advantages of the invention will be appreciated upon reading of the following description of the invention when taken in conjunction with the attached drawings, with the understanding that some modifications, variations and changes could be easily made by the skilled person in the art to which the invention pertains without departing from the spirit of the invention or the scope of the claims appended hereto.

BRIEF DESCRIPTION OF THE DRAWINGS

For a better understanding of the invention, reference is made to the attached drawings, wherein.

DETAILED DESCRIPTION OF THE INVENTION

The present invention will be explained in more detail with reference to the attached drawings.

Figure 1:
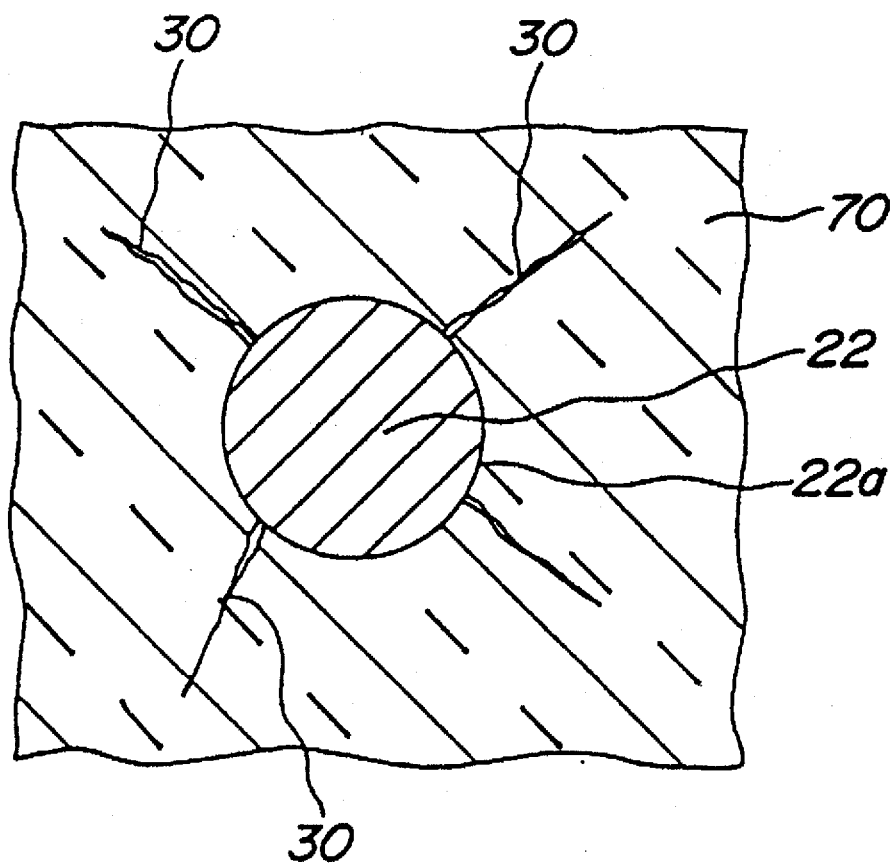
FIG. 1 is a sectional view for schematically illustrating the state in which cracks are formed near a resistive heating element 22 buried inside a substrate 70.
Figure 2:
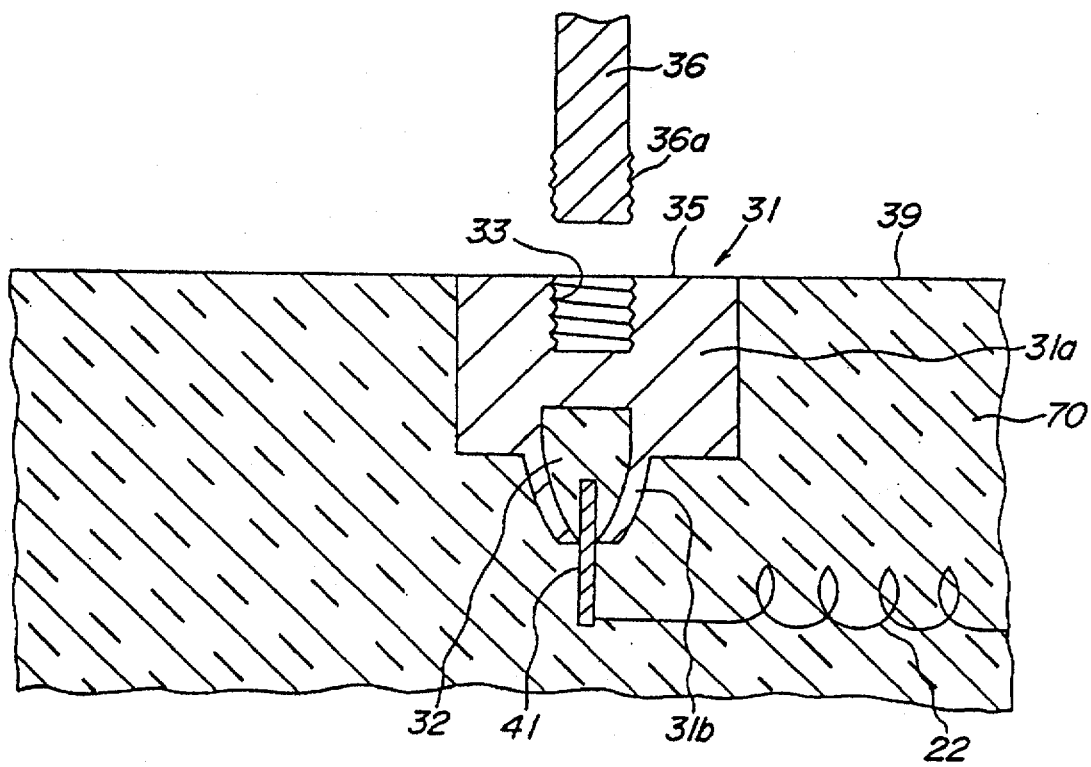
FIG. 2 is a sectional view for schematically illustrating a portion of a ceramic heater near a joint between a terminal 31 and a resistive heating element 22.

FIG. 2 is a sectional view for schematically illustrating a portion of a ceramic heater of the present invention near a block terminal 31. A substrate 70 is made of aluminum nitride. Into this aluminum nitride may be added an additive and a sintering aid such as an oxide and a halide of a rare earth element.

In particular, it was found out that aluminum nitride is preferably used in the case of the ceramic heater for the semiconductor-producing apparatus. That is, it was found out that aluminum nitride has excellent corrosion resistance against a halogen-based corrosive gas such as $ClF_3$ used in the semiconductor-producing apparatus.

In this embodiment, the resistive heating element 22 is composed of a spirally coiled body. A planar pattern and arrangement of this wound body may be appropriately varied. For example, the coiled member may be shaped in a swirled form as viewed in a plane. To an end of the resistive heating element 22 is joined a block terminal 31 mentioned later. A rod-shaped lead wire 36 is provided at a terminal end of an electricity power supply cable not shown. The lead wire 36 is joined to the block terminal 31 as mentioned later. Electric power is supplied from outside through the electric power supply cable. By so constructing, the ceramic heater can be heated up to the maximum temperature of, for example, 1,100° C. or further up to 1,200° C.

Next, the construction of the block terminal 31 will be explained. The block terminal 31 and the resistive heating element 22 are joined to each other through press fitting, so-called caulking. The block terminal 31 is made of a metal having a high melting point, and comprises a columunar terminal body 31a and a cylindrical press-fitting portion 31b when not yet collapsed.

An end portion 41 of the resistive heating element 22 is inserted into a space 32 inside the cylindrical press-fitting portion 31b, and the cylindrical press-fitting portion 31b is collapsed at an end portion by pressing it in a shape following the outer periphery of the inserted end portion 41 as shown in FIG. 2. Thereby, the end portion 41 is fixed inside the space 32 defined by the collapsed cylindrical fitting portion 31. In the caulking step, the terminal 31 is preferably heated at a high temperature of not less than 800° C. in a reducing gas atmosphere. In the above step, the resistive heating element 22 is joined to the terminal 22.

As shown in FIG. 2, an end face 35 of the terminal 31 is exposed to a rear face 39 of the substrate 70 by grinding the face 39. A female screw 33 is formed in the block terminal 31, and a male screw 36a of the lead wire 36 is meshed with the female screw 33.

According to the present invention, the terminal 31 is made of a metal having a high melting point with a coefficient of thermal expansion not smaller than that of the substrate 70 made of aluminum nitride. The resistive heating element 22 is made of a metal having a high melting point with a coefficient of thermal expansion not smaller than that of the substrate made of the aluminum nitride. The coefficients of thermal expansion of aluminum nitride and other metal having high melting points in a range of 20° C. to 1400° C. are given below. In the table, [Mo(70)/W(30)] means that the ratio of molybdenum is 70 atom % and that of tungsten is 30 atom %.

TABLE 1

| | |
|---|---|
| rhodium | 8.30 × 10⁻⁶/°C. |
| niobium | 7.31 × 10⁻⁶/°C. |
| iridium | 6.8 × 10⁻⁶/°C. |
| rhenium | 6.70 × 10⁻⁶/°C. |
| tantalum | 6.5 × 10⁻⁶/°C. |
| molybdenum | 6.4 × 10⁻⁶/°C. |
| Mo(70)/W(30) | 5.6 × 10⁻⁶/°C. |
| Mo(50)/W(50) | 5.4 × 10⁻⁶/°C. |
| aluminum nitride | 5.4 × 10⁻⁶/°C. |
| Mo(30)/W(70) | 5.0 × 10⁻⁶/°C. |
| tungsten | 4.7 × 10⁻⁶/°C. |
| osmium | 4.6 × 10⁻⁶/°C. |

As is seen in Table 1, rhodium, niobium, iridium, rhenium, tantalum, molybdenum and alloys thereof may be used as the high melting point metal constituting the resistive heating element 22. The present inventors produced ceramic heaters with use of respective metals as a material for the resistive heating element according to hot press sintering.

As a result, it was found out that when the resistive heating element 22 was formed from rhodium, niobium, iridium, rhenium or tantalum, these metals slightly reacted with aluminum nitride, and the resistance of the resistive heating element 22 considerably increased after the hot press sintering, as compared with the resistance before the hot press sintering. It was also confirmed that when the resistive heating element 22 is formed from molybdenum, increase in the resistance of the heat generator is relatively smaller.

Alloys between tungsten and the above metals may be used so long as the coefficients of thermal expansion of the alloys are not smaller than that of aluminum nitride. Among these alloys, an alloy between molybdenum and tungsten may be most preferably used. In this molybdenum-tungsten alloy, the ratio of molybdenum needs to be not less than 50 atom %.

It is necessary that the area of the exposed face 35 is large enough to allow the provision of the female screw. In order to realize the heat-resistive and corrosion-resistive joining between the electric power supply member and the terminal, the area of the exposed face 35 needs be not less than 10 mm².

Figure 3:
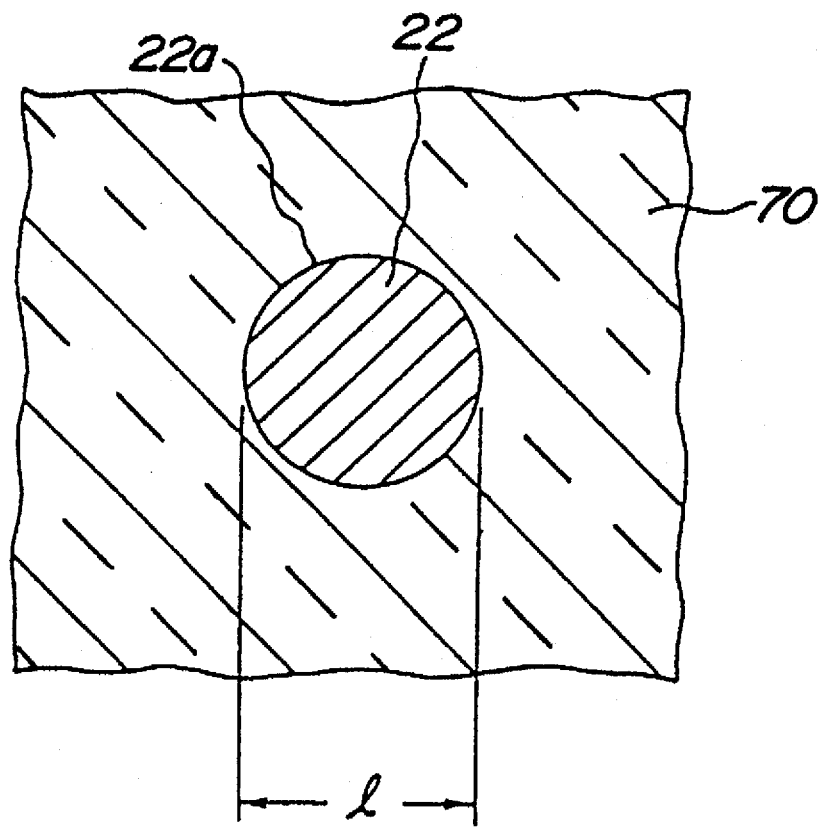
FIG. 3 is a sectional view for schematically illustrating a portion of the ceramic heater in which the resistive heating element 22 is buried in the substrate 70.

The diameter "l" of the resistive heating element 22 as shown in FIG. 3 is preferably 0.3 mm to 0.6 mm. If the diameter "l" of the resistive heating element 22 is less than 0.3 mm, the ratio of the reacted layer in the wire member after the firing increases, which conspicuously increases the resistance of the heat generator or causes variation therefor. Further, if the diameter of the resistive heating element is small, the pitch of the wound body needs to be set larger. If the wound body constituted by the resistive heating element with a smaller diameter and having a larger pitch is to be buried, the wound body is difficult to handle and easy to be deformed.

If the diameter "l" of the resistive heating element 22 is more than 0.6 mm, the resistive heating element 22 becomes hard, so that its spring back force increases to make the handling difficult during the production process.

Further specific experimental results will be explained below. As mentioned before, a joint body between a resistive heating element 22 and a terminal 31 as shown in FIG. 2 was produced. As aluminum nitride, an aluminum nitride powder into which $Y_2O_3$ was added in an amount of 5 wt % relative to 100 wt % of aluminum nitride, and the powder was preliminarily molded. At that time, a continuous recess or groove was formed along a given planar swirling pattern on a surface of the preliminarily molded body.

The joined body of the resistive heating element 22 and the terminal 31 is placed in the above groove, and additional aluminum powder is charged onto the joined body. Then, the resulting was uniaxially press molded to produce a discoidal molded body. The discoidal molded body was sintered by hot pressing at 1900° C. for 2 hours, and the sintered body was left to be cooled.

In each example, the block terminal 31 was made of molybdenum. The material for the resistive heating element 22 was selected from among those shown in Table 2. The diameter of the resistive heating element 22 was set at 0.5 mm. The ceramic heater in each example was subjected to heating-cooling cycles between 50° C. and 800° C.

The heater was heated at a heating rate of 10° C./min., and when the heater reached 800° C., it was held at 800° C. for 2 hours. Then, the heater was cooled at a cooling rate of 10° C./min. This heating-cooling step was taken as one heat cycle. The heating-cooling cycles were repeated at the maximum number of times of 1000, and whether the substrate 70 was broken near the resistive heating element 22 or not was confirmed.

TABLE 2

| Material of resistive heating element 22 | Number of heating-cooling cycles causing fracture of substrate 7 |
| --- | --- |
| molybdenum | not fractured even after 1000 heating and cooling cycles |
| Mo(70)/W(30) | 921 |
| Mo(50)/W(50) | 707 |
| Mo(30)/W(70) | 31 |
| tungsten | 8 |

As is seen from Table 2, when the resistive heating element 22 was formed from tungsten or the tungsten-molybdenum alloy [Mo(30)/W(70)] having the coefficient of thermal expansion smaller than that of aluminum nitride, a microcrack was formed at the interface between the resistive heating element 22 and the substrate 70 through the heat cycles. This microcrack propagated during the heat cycles, which caused fracture of the substrate 70.

On the other hand, when the resistive heating element 22 was formed from molybdenum, the tungsten-molybdenum alloys [Mo(50)/W(50)] or [Mo(70)/W(30)], the number of the heating-cooling cycles which causes the fracture of the substrate 70 could be largely increased. Thus, the performance of the ceramic heater could be improved.

Particularly, when pure molybdenum was used, the substrate 70 was not fractured even after 1000 heating-cooling cycles. Thus, pure molybdenum has the greatest durability against the heat cycles, and is particularly preferred.

Next, the present inventors further investigated the example which exhibited the most excellent durability against the heat cycles among the experimental results obtained above, that is, the example using molybdenum alone as the material for the resistive heating element. For, durability of this example against the heat cycles was particularly conspicuously improved.

As a result, it was found out that when a resistive heating element includes a heat generator body made of a metal having a high melting point and a coefficient of thermal expansion not smaller than that of the substrate, a carbide layer having a metal with a high melting point and provided on the outer side of a heat generator body and an oxide layer having a high melting point and provided on the outer side of the carbide layer, durability against the heat cycles can be particularly improved. Specifically, it was found out that when the high melting point metal is selected from molybdenum and an alloy containing molybdenum, the molybdenum carbide layer and the molybdenum oxide layer are formed on the outer side of the heat generator body during the firing.

The ceramic heater was produced as mentioned above. In the above, the diameter of the molybdenum wire was 0.4 mm, the hot press sintering time was 4 hours, and the pressure was 200 kg/cm$^2$. With respect to the thus produced ceramic heater, the microstructure of the resistive heating elements made of molybdenum was investigated by optical microscopic photographs and EPMA analysis.

Figure 4:
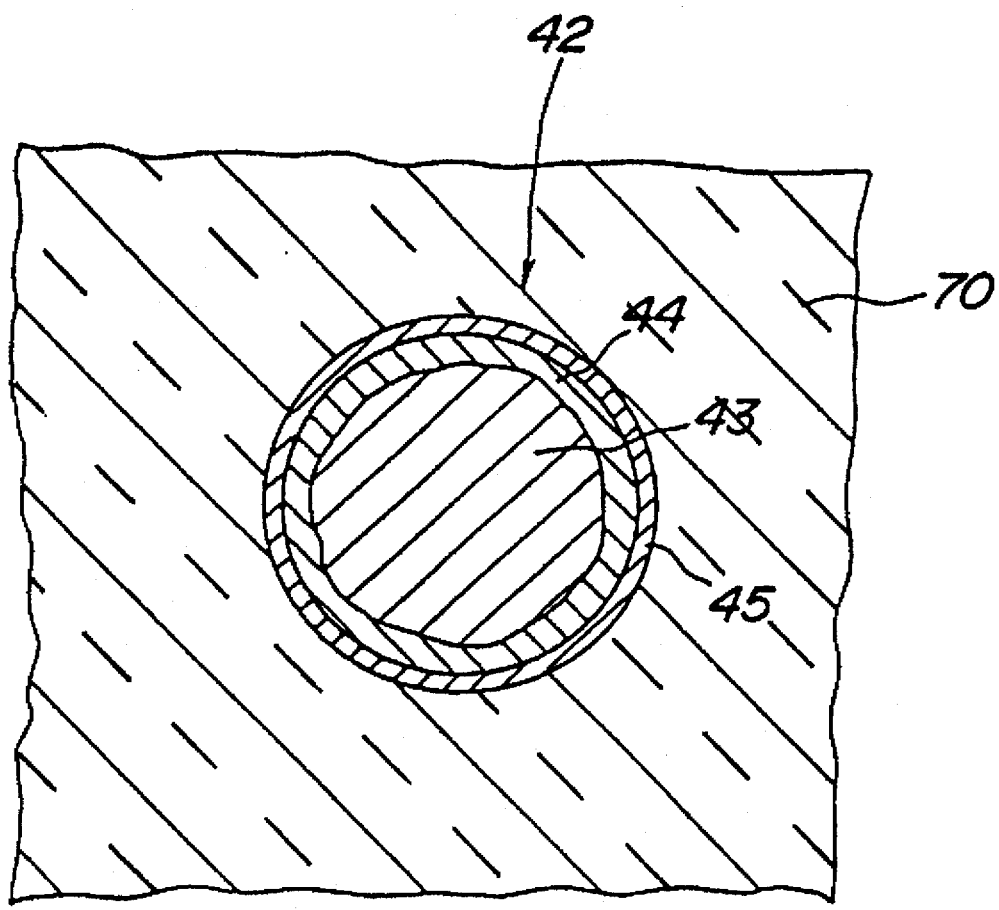
FIG. 4 is a sectional view of a resistive heating element 42 having a laminated structure composed of a molybdenum layer 43, a molybdenum carbide layer (MoCx layer) 44 and a molybdenum oxide layer (MoOx layer) 45.

Consequently, contrary to the inventors' presumption, as illustrated in FIG. 4, the resistive heat generator 42 was constituted by a laminated structure composed of a heat generator body 43 made of molybdenum, a molybdenum carbide layer (MoCx layer) 44 and a molybdenum oxide layer (MoOx layer) 45. When the resistive heating element 42 having such a laminated structure was produced, durability against the heat cycles was conspicuously improved.

That is, it was clearly observed through the optical microscopic photograph that a thin molybdenum oxide layer (MoOx layer) was colored yellow.

Further, the EPMA analysis results were analyzed as follows. The present inventors confirmed the distributed state of molybdenum, that of carbon, and that of oxygen with respect to a section of the resistive heating element through the EPMA analysis. As a result, molybdenum was uniformly distributed inside the resistive heating element 42. On the other hand, the intensity of molybdenum was lower near the outer peripheral portion of the resistive heating element 42 as compared with that of the inner portion of the heat generator 42.

The observation of the distributed state of carbon revealed that a larger amount of carbon existed near the outer peripheral portion of the resistive heating element 42. This shows the presence of the molybdenum carbide layer 44 (MoCx layer). Further, the observation of the distributed state of oxygen revealed that a larger amount of oxygen existed immediately outside the area where the large amount of carbon existed. This shows that the molybdenum layer (MoOx layer) 45 existed.

It is considered that the molybdenum-rich layer 44 was produced with carbon mixing into the molybdenum constituting the resistive heating element body from an organic binder contained and remaining in a molded body or an atmosphere during the hot press firing. Further, it is considered that the molybdenum oxide layer (MoOx layer) 45 was formed with oxygen coming out from alumina formed on a surface layer of aluminum nitride or yttria added as a sintering aid during firing and reacting with molybdenum.

The reason why the above mentioned function and effects can be obtained by the above-mentioned laminated structure is not clear, but it is considered that the molybdenum oxide layer 45 functions as a protective layer or a stress-mitigating layer.

With respect to the above examples, the present inventors examined ceramic heaters using tungsten as a material for a resistive heating element by scanning type electron microscope microphotograph and EPMA analysis. As a result, it was confirmed that the outer peripheral surface of the heat generator body made of tungsten was covered with a thin film of tungsten carbide. In this case, the thin tungsten carbide film did not particularly function to prevent the fracture of the substrate.

In the ceramic heater, the sectional shape of the resistive heating element 22 may be triangular, rectangular, hexagonal, octagonal or the like. In the above examples, the resistive heating element is spirally wound, but the heat generator may be waved in a plane.

The terminal body 31a of the terminal 31 may be shaped in various ways, and for example, may have a columnar shape having a triangle, elliptic, rectangular, or hexagon-section or the like. Further, the resistive heating element may be joined to the terminal by winding the former around the latter or welding them together besides the above caulking.

In the above embodiment, the ceramic heater is preferably designed in a discoidal form so as to uniformly heat a round wafer. However, the ceramic heater may be designed in a rectangular or hexagonal planar form or the like. In the above embodiment, aluminum nitride added with $Y_2O_3$ was used. By varying the kind of the additive, the coefficient of thermal expansion of aluminum nitride can be slightly changed.

As mentioned above, the ceramic heater according to the present invention has such excellent durability that the substrate may hardly be fractured even by 1000 times heating-cooling cycles. The present inventors made further investigations so as to develop applications of ceramic heaters. During the investigation, an extremely useful use has been discovered, which made the inventors accomplish a heating device as a further aspect of the present invention. This aspect of the invention will be explained in more detail.

As mentioned above, the ceramic heater according to the present invention is very suitable for various semiconductor-producing apparatus such as the plasma CVD, the pressure-reduced CVD, the plasma etching apparatus, the optoetching apparatus, etc. Accordingly, the present inventors first investigated the technique in which a semiconductor wafer was placed and then heated on a heating surface of a ceramic heater. The present inventors have come to recognize the following problems during this investigation.

That is, the installation cost is being increasing in the factories for the mass production 16 DRAM semiconductors, and in the semiconductor wafer-treating apparatuses, improvement on the through-put (treating amount of the wafers) and reduction in the downtime required for maintenance of the apparatus are demanded. Particularly, a heater is arranged inside a vessel in the hot CVD, the epitaxial apparatus, the sputtering apparatus, and the etching apparatus, the semiconductor wafer is placed on the heater, and then the wafer is heated to a high temperature.

In order to maintain the apparatus, one must await cooling of the ceramic heater until the ceramic heater can be handled. The sum of the cooling time, the working time at low temperatures and the time required for heating is the downtime of the apparatus. This downtime is required to be reduced as much as possible.

However, it ordinarily takes one hour or more to cool the ceramic heater down to 80° C. or less after stopping the supply of the electric power to the resistive heating element following the treatment of the semiconductor wafer under heating at 1000° C. and to heat the substrate again from 80° C. to 1000° C. Thus, the downtime was long.

Therefore, it has been demanded that the temperature of the ceramic heater can be arbitrarily and rapidly changed particularly by enhancing response of the ceramic heater so that the objects to be heated may be treated at a high efficiency.

Further, when a melt such as an alloy of aluminum or the like is allowed to be cooled and solidified or when a melt of glass is allowed to be cooled and solidified, a technique is considered in which a sample is melted by a ceramic heater having high heat resistance, and a solidified alloy or glass is produced by solidification through leaving the melt to be cooled. However, it took a long time for the alloy or glass to be cooled and the alloy or glass having a stable phase at high temperatures could not be produced at high productivity. In particular, according to the aluminum Reflow technique, aluminum is sputtered upon a wafer, and aluminum is then heated to a temperature higher than its melting point, and the melt is then flown into a trench. Thereafter, a wafer needs to be rapidly cooled. Thus, the productivity and the uniform heating can be enhanced by rapidly cooling, resulting improving the quality.

Accordingly, the present inventors have designed the heating device which includes the above ceramic heater and a cooler for cooling the ceramic heater. By employing this heating device, the heating device can be arbitrarily heated and cooled so that its temperature can be rapidly changed with high response. Therefore, samples can be treated at high efficiency.

Apart from the above, when the ceramic heater is provided with the rapidly cooling function in addition to the rapidly heating function, the ceramic heater is continuously subjected to heating-cooling cycles at a great number of times. However, the ceramic heater according to the present invention has excellent heat resistance and heat impact resistance, and its substrate is difficult to be fractured even when the heater is subjected to heating-cooling cycles at a great number of times.

Furthermore, since aluminum nitride constituting the substrate is a material having an extremely large heat conductivity among the ceramics, the temperature of the material which is to be heated and contacts the surface of the substrate can be very rapidly and precisely varied. It is preferable to set the cooling rate in this case at not less than 60° C./min. from the standpoint of the high speed response. Further, response at the maximum speed heating up to 600° C./min. and the maximum cooling speed up to 200° C./min. can be realized.

Assume that semiconductor wafers are treated as samples in the heating device according to the present invention and the heating device are to be maintained. At that time, the ceramic heater upon which a semiconductor wafer is to be placed can be rapidly cooled down to such a handable temperature such as 80° C. by cooling the ceramic heater with the cooler. Therefore, the downtime can be largely reduced as compared with the conventional ceramic heaters, so that the through-put of the semiconductors is increased.

In the heating device of the present invention, it is possible that when the material to be heated is a solid alloy or solid glass, the alloy or glass having a stable phase at high temperatures can be produced by rapidly cooling the ceramic heater with the cooler immediately after the heat treatment of the alloy or glass at high temperature.

Moreover, the heating device according to the present invention is useful particularly in the case where the objects to be heated require heat treatment to be effected according to a precise temperature schedule. For, the heating device according to the present invention can perform rapid heating and rapid cooling.

When the cooling means is a cooling fluid feeder, heat of the ceramic heater and the heated object can be rapidly removed by flowing the cooling fluid through the cooler. As the cooling fluid, for example, compressed air and cooling water may be recited. When the capacity of the ceramic heater is small, the heater can be cooled at a sufficiently rapid speed by using a thermoelectric element.

When the compressed air is used, the heater is further cooled through expansion of the air when the compressed air is ejected through a nozzle, which promotes the cooling.

A surface of the ceramic heater to be cooled is preferably a surface other than that upon which the object to be heated is to be placed. As that surface, a surface opposite to the object-placed surface or positioned on the side of this surface may be used. Further, it may be that a recess or through-hole is formed in the ceramic heater, and the heater is cooled by feeding the cooling fluid into the recess or through-hole.

Figure 5:
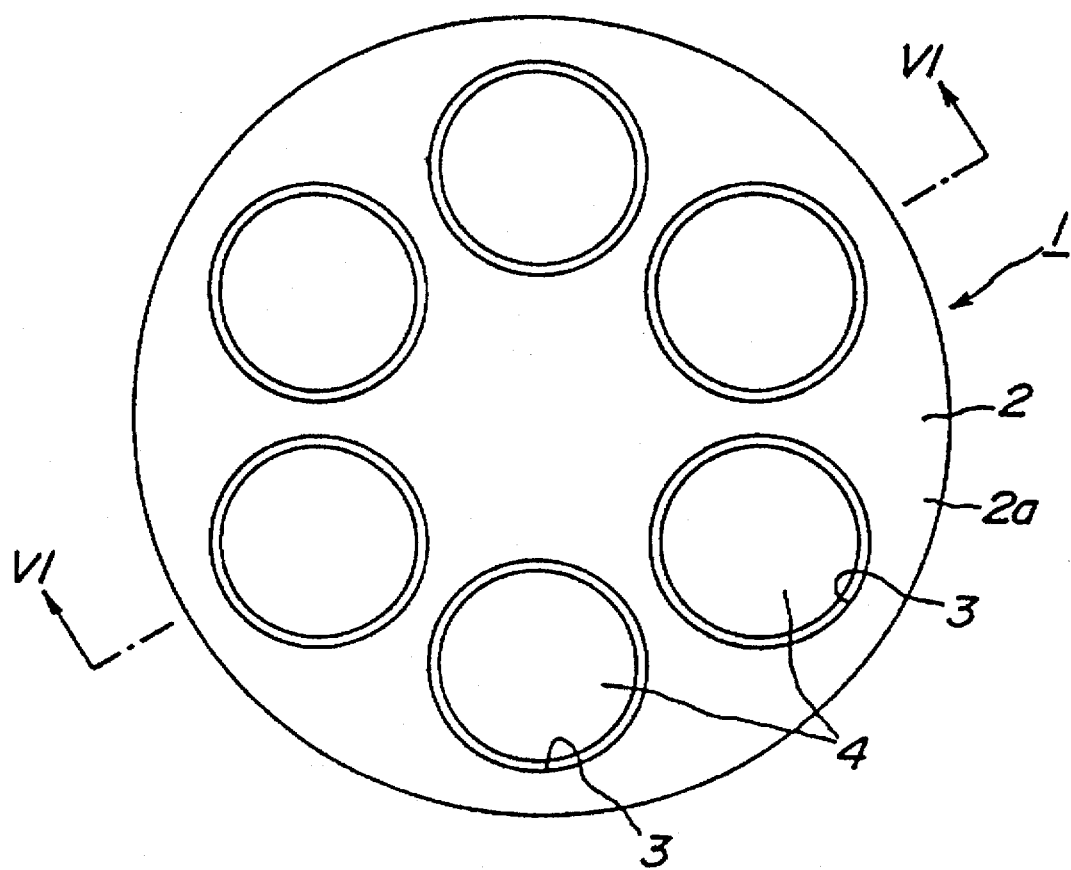
FIG. 5 is a plan view for illustrating a ceramic heater 1 for a batch type hot CVD apparatus.
Figure 6:
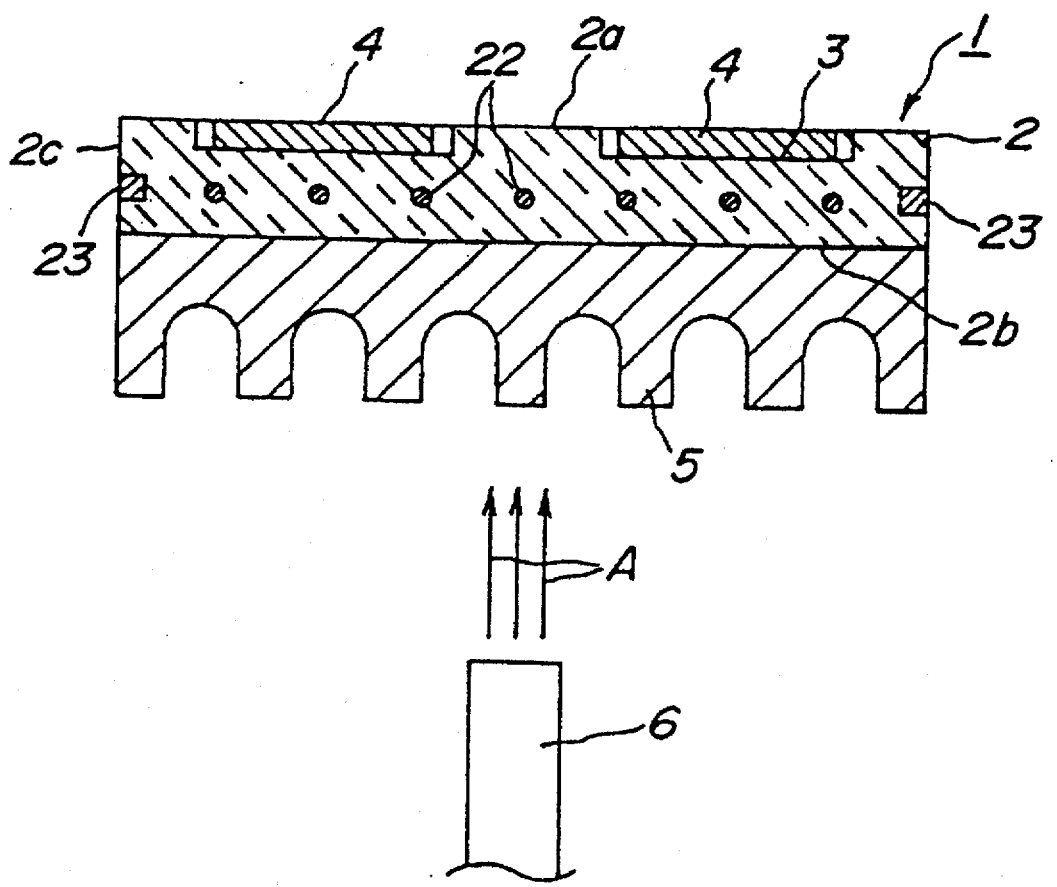
FIG. 6 is a sectional view of the ceramic heater cut along a line VI—VI.

FIG. 5 is a plan view of a heater 1 for a batch type hot CVD apparatus. FIG. 6 is a sectional view of a susceptor in FIG. 5 cut along a VI—VI line. A substrate 2 of the heater 1 is made of aluminum nitride, and has almost discoidal shape. Round installing recesses 3 are formed in a front surface 2a of the substrate 2. In this embodiment, the number of the recesses 3 is 51×(6).

Inside the substrate 2 is buried a resistive heating element 22, which has opposite ends connected to respective block terminals 23, 23. Each block terminal 23 is exposed to a peripheral surface 2c of the substrate 2. In this embodiment, the resistive heating element 22 is made of molybdenum or tungsten.

Heat-emitting fins 5 are provided as a heat-emitting section at a bottom surface 2b of the substrate 2. A semiconductor wafer 4 is placed in each recess 3. The material of the substrate 2 is AlN. The heater 1 with the molybdenum heat generator and that with the tungsten heat generator were subjected to a cooling test, and comparison evaluation results are shown in Table 3. With respect to the materials of the substrate 2, whether abnormality existed or not was examined.

Each heater 1 was heated up to 1000° C. A nozzle 6 was arranged under the fins 5, and compressed air was ejected and blown toward the fins 5 through a tip of the nozzle along arrows A, thereby cooling the heater 1. At that time, the temperature of the compressed air before ejecting was 25° C., and the ejecting rate was 1 m³/min. The outer diameter of the heater was 8 inches. This heater was subjected to heating-cooling cycles at 100 repetition times.

TABLE 3

| Experimental No. | 1 | 2 |
| --- | --- | --- |
| resistive heating element | molybdenum | tungsten |
| time required for cooing wafer-placed surface (min.) | 10 | 10 |
| state of substrate | not changed | fractured by 15 heating-cooling cycles |

As seen from Table 3, no change occurred even at the heating-cooling cycles at 100 cycles when the molybdenum resistive heating element was used (Experimental No. 1). On the other hand, when the tungsten heat generator was used, the substrate was fractured at 15 heating-cooling cycles (Experimental No. 2).

When the molybdenum resistive heating element was used, the substrate was not fractured even when the cooling power was increased. If the cooling speed gives near 1000° C. cooling in as short as 2 to 3 minutes, the substrate could be prevented from being fractured. Therefore, such a heater can be practically used even at an extremely high cooling rate.

Figure 7:
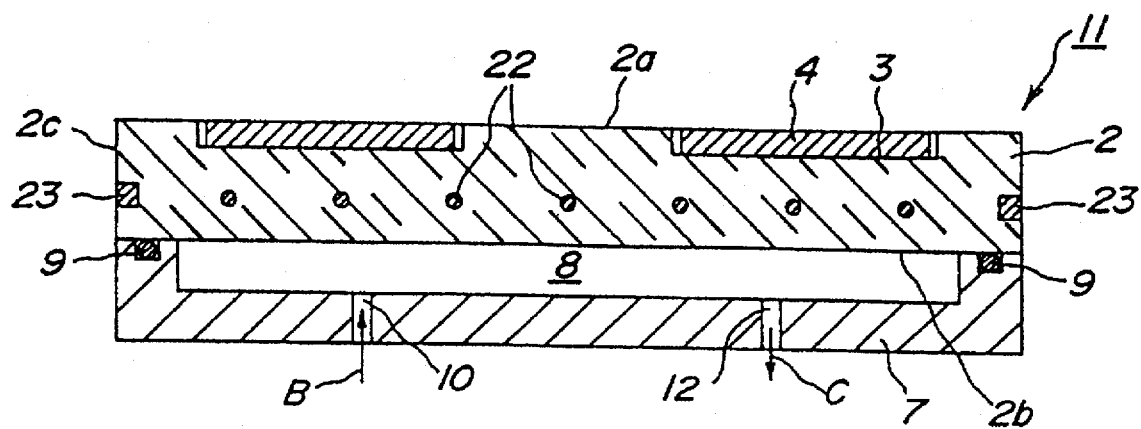
FIG. 7 is a sectional view for illustrating another embodiment of the ceramic heater 11 according to the present invention.

FIG. 7 is a sectional view for schematically illustrating a heater 11 as another embodiment. A substrate 2 has the same construction as that in FIGS. 5 and 6. In the embodiment of FIG. 7, a cooling vessel 7 is provided on a side of the bottom surface 2b of the substrate 2, and an end face of the cooling vessel 7 and the bottom surface 2b are sealed with a sealing member such as an O-ring made of a metal.

A space 8 is defined between the cooling vessel 7 and the bottom surface 2b, and a feeding opening 10 and a discharge opening 12 are provided in the cooling vessel 7. A cooling fluid is fed into the space 8 through the feed opening 10 along an arrow B, and discharged through the discharge opening 12 in an arrow direction C.

Figure 8:
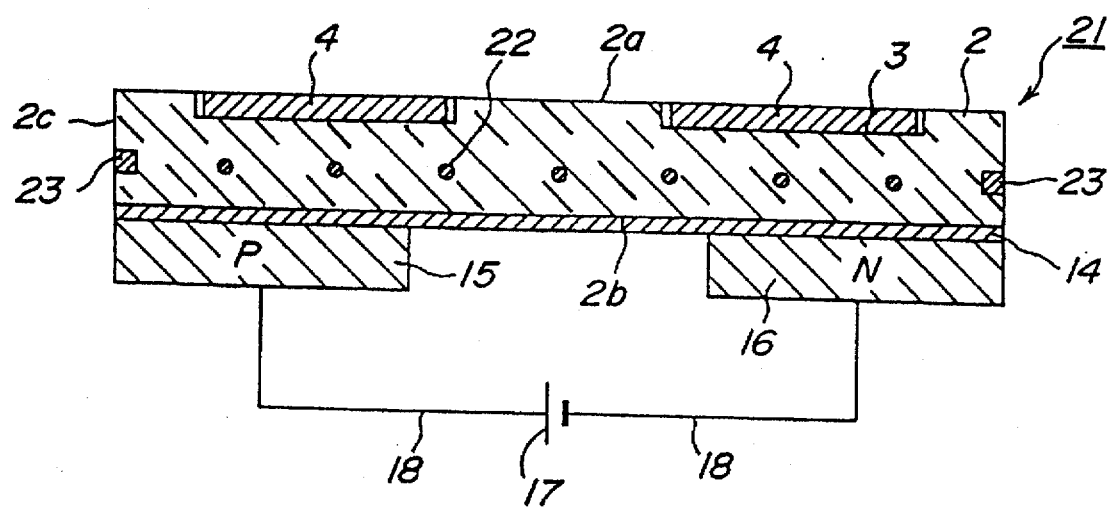
FIG. 8 is a sectional view for schematically illustrating a further embodiment of a ceramic heater 21 using a thermoelectric element according to the present invention.

FIG. 8 is a sectional view for schematically illustrating a heater 21 as a further embodiment. A substrate has the same construction as that in FIGS. 5 and 6. In the embodiment of FIG. 8, a thermoelectric element is used as cooler on the side of the bottom surface 2b of the substrate 2. Specifically, an electrically conductive film 14 is formed on the bottom surface 2b, and a P type semiconductor film 15 and an N type semiconductor film 16 are joined to the electrically conductive film 14. Positive and negative poles of a DC power source 17 are connected to the P type semiconductor film 15 and the N type semiconductor film 16, respectively.

According to the ceramic heater of the present invention using the aluminum nitride substrate, the resistive heating element is made of a metal having a coefficient of thermal expansion not smaller than that of the substrate made of aluminum nitride and having a high melting point. Therefore, even when the ceramic heater is subjected to the repeated heating-cooling cycles, cracking of the substrate near the resistive heating element and propagation of such cracks can be prevented.

What is claimed is:

1. A ceramic heater comprising:
    a substrate consisting essentially of aluminum nitride;
    a resistive heating element buried in said substrate, said resistive heating element comprising a heat generator body comprised of metal having a thermal expansion coefficient not less than a thermal expansion coefficient of said substrate, a carbide layer provided on an outer surface of said heat generator body, and an oxide layer provided on an outer surface of said carbide layer; and
    terminals electrically connected to said resistive heating element, said terminals being buried in said substrate and being comprised of a metal having a thermal expansion coefficient not less than the thermal expansion coefficient of said substrate, wherein the thermal expansion coefficient of each of the terminals and said resistive heating element is in a range of $5.0 \times 10^{-6}$/°C. to $8.3 \times 10^{-6}$/°C.

2. The ceramic heater of claim 1, wherein said metal of the heat generator body comprises molybdenum, said carbide layer comprises molybdenum carbide, and said oxide layer comprises molybdenum oxide.

3. The ceramic heater of claim 1, wherein the metal of said heat generator body has a melting point that is greater than a sintering temperature of said substrate and not less than 1800° C.

4. The ceramic heater of claim 1, wherein the metal of said terminals has a melting point that is greater than a sintering temperature of said substrate and not less than 1800° C.

5. The ceramic heater of claim 1, wherein the substrate has a receiving surface for receiving semiconductive wafers that are to be heated.

6. The ceramic heater of claim 1, wherein said resistive heating element comprises molybdenum-tungsten alloy, a content of the molybdenum in the alloy being 50 to 100 atomic %.

7. The ceramic heater of claim 1, wherein the ceramic heater is produced by hot press sintering.

8. The ceramic heater of claim 1, wherein the substrate is substantially free from microcracks.

9. The ceramic heater of claim 1, wherein said substrate further includes a rare earth element.

10. The ceramic heater of claim 1, wherein said resistive heating element has a resistance that is increased via a reaction during sintering of the ceramic heater.

11. The ceramic heater of claim 1, wherein at least one of said terminals has an exposed face, said exposed face being not less than 10 mm$^2$.

12. The ceramic heater of claim 1, wherein said resistive heating element has a diameter within a range of 0.3–0.6 mm.

13. The ceramic heater of claim 1, wherein the ceramic heater has a discoidal shape.

14. The ceramic heater of claim 1, wherein said heater is provided for heating semiconductive wafers.

15. A heating device comprising:

a ceramic heater comprising: (i) a substrate consisting essentially of aluminum nitride; (ii) a resistive heating element buried in said substrate, said resistive heating element comprising a heat generator body comprised of metal having a thermal expansion coefficient not less than a thermal expansion coefficient of said substrate, a carbide layer provided on an outer surface of said heat generator body, and an oxide layer provided on an outer surface of said carbide layer; and (iii) terminals electrically connected to said resistive heating element, said terminals being buried in said substrate and being comprised of a metal having a thermal expansion coefficient not less than the thermal expansion coefficient of said substrate, wherein the thermal expansion coefficient of each of the terminals and said resistive heating element is in a range of $5.0 \times 10^{-6}$/°C. to $8.3 \times 10^{-6}$/°C.; and a cooling device for cooling said ceramic heater.

16. The heating device of claim 15, wherein said cooling device is adapted to cool said ceramic heater at a cooling rate of not less than 60° C./min.

17. The heating device of claim 15, wherein said cooling device comprises a cooling vessel.

18. The heating device of claim 15, wherein said cooling device comprises a thermoelectric element.

19. The heating device of claim 15, wherein said cooling device comprises a heat-emitting section including a plurality of heat-emitting fins.

* * * * *